United States Patent [19]
Tarn

[11] Patent Number: 5,337,217
[45] Date of Patent: Aug. 9, 1994

[54] INTEGRATED CIRCUIT PACKAGE FOR AN IMAGE SENSOR

[75] Inventor: Terry Tarn, Pittsford, N.Y.

[73] Assignee: Eastman Kodak Company, Rochester, N.Y.

[21] Appl. No.: 23,024

[22] Filed: Feb. 25, 1993

[51] Int. Cl.⁵ .......................... H05K 1/11; H05K 5/00
[52] U.S. Cl. .................................. 361/784; 361/730; 361/807; 257/678; 174/52.1
[58] Field of Search ............... 361/728, 730, 748, 752, 361/760, 761, 767, 784, 796, 807; 174/52.1, 52.2, 52.3, 52.4, 52.5; 257/678, 680, 681, 703, 704

[56] References Cited
U.S. PATENT DOCUMENTS

| | | |
|---|---|---|
| 4,355,229 | 10/1982 | Zimmerman et al. ....... 250/214 VT |
| 4,807,019 | 2/1989 | Tustaniwskyj . |
| 5,132,532 | 7/1992 | Watanabe ........................... 250/239 |
| 5,200,367 | 4/1993 | Ko ..................................... 174/52.4 |

Primary Examiner—Leo P. Picard
Assistant Examiner—Bot Ledynh
Attorney, Agent, or Firm—Raymond L. Owens

[57] ABSTRACT

An integrated circuit package for a charge-coupled image sensor. The package comprises first and second ceramic bodies being fused together to form a unitary structure; a CCD image sensor mounted on the first ceramic body; and, electrical circuitry mounted on the second ceramic body.

8 Claims, 2 Drawing Sheets

INTEGRATED CIRCUIT PACKAGE FOR AN IMAGE SENSOR

FIELD OF THE INVENTION

This invention relates to an integrated circuit package for an image sensor.

INTRODUCTION TO THE INVENTION

An important class of image sensors comprises a charge-coupled device (CCD) having an array of photodetectors. Associated with the CCD are independent support electronic components, like preamplifiers and amplifier circuits, that are to be brought, in some way, into a mechanical/electrical cooperative relationship with the CCD.

Three important and typical manufacturing techniques are known which purport to effect the required cooperative relationship between the CCD and the support electronics. In a first technique, a small hybrid thick film substrate comprising a support electronics may be mechanically attached to the back of the CCD. An electrical connection between the CCD and the support electronics may be made at this location. In a second technique, a small printed circuit board comprising a support electronics may be mechanically and electrically connected to the back of the CCD. In a third technique, a very long cable (meters) may be used to electrically connect a physically remote support electronics to the CCD.

A comparison is now provided as to the various advantages/disadvantages of these three techniques.

Recall that the first two techniques comprising the hybrid thick film substrate and the printed circuit board, respectively, locate the mechanical/electrical interface between the CCD and support electronics, precisely at the CCD. This proximal relationship has an advantage, as compared to the third techniques' long remote cable, of substantially eliminating parasitic capacitances that may be developed over the long cable, as well as substantially eliminating electronic time delays that may be developed over the long cable, thereby realizing higher signal processing capabilities of the CCD.

These "electrical" advantages may be offset, however, for the following reasons.

First, precisely because the first two techniques locate the electrical/mechanical interface proximal to the CCD, one has heretofore been obliged to disadvantageously scale down and simplify the support electronics, to match (desirable) ever increasing diminutions in the size of emergent small CCD's. It is to be appreciated, in this respect, that an effective size of such a CCD imaging head, used, for example, as a medical probe, is approximately 5 to 8 m. However, the scaled down and simplified electronics that can be accommodated to mate with the small imaging head compares most unfavorably with the long remote cable (despite its disadvantages, noted above), since the remote cable can feed into a remote support electronics comprising any arbitrary size and complexity, and one having a greater heat dissipating capability.

Second, it is only with great difficulty that the small scale support electronics can be mechanically attached to the CCD. For example, soldering techniques are most difficult to effect in this type of small scale environment, and it is very difficult to shield the sensitive CCD from the deleterious heat effects of the solder.

Third, it may be a disadvantage to locate proximally the CCD and support electronics, within the context of the prior art, since the cited interface techniques may compromise the integrity of a desired independent testing of the electronic specifications of the CCD and/or the support electronics.

A summary made of the comparison of the advantages/disadvantages of the three cited CCD-support electronic interface techniques, demonstrates that all three techniques provide a mixture of advantages and disadvantages. For example, the hybrid substrate and printed circuit board have various "electrical" advantages compared to the remote cable and concomitant "mechanical" disadvantages. This situation is basically the reverse for the remote cable.

SUMMARY OF THE INVENTION

From this comparison, we cull for ourselves the following objective-to provide an optimal electrical/mechanical interface between a CCD and its attendant support electronics.

To this end, we now disclose a novel integrated circuit package. The novel integrated circuit package comprises:

(a) first and second ceramic bodies being fused together to form a unitary structure;

(b) a CCD image sensor mounted on the first ceramic body; and (c) electrical circuitry mounted on the second ceramic body.

The integrated circuit package of the present invention can realize important electrical, mechanical and manufacturing advantages.

Electrical advantages proceed from the following considerations. The present invention locates support electronics in physical proximity to the CCD. This arrangement can substantially reduce or eliminate parasitic capacitances that may develop between the support electronics and CCD, as well as reduce electrical time delays between these entities. This arrangement, therefore, enables the CCD to realize higher signal processing capabilities.

The design incorporated in the present invention, moreover, has a unique advantage of being able to accommodate (desirable) ever increasing diminutions in the size of a CCD imaging head, without a concomitant obligatory reduction in the scale or complexity of the support electronics. This follows since the support electronics, while juxtaposed to the CCD, are located on an independent second ceramic body, which can be provided with independent dimensions, for example, length, to thereby accommodate a desired support electronics without the necessity of a scaledown factor.

The present invention can realize these electrical advantages without offsetting mechanical disadvantages, for the following reasons. Mechanical attachment of the support electronics to the CCD is provided by a process that co-fires and fuses the first and second ceramics to create a single package. The mechanical attachment is therefore straightforward, and eschews techniques like soldering which are difficult to do in these small scale environments, and which may be deleterious due to uneven heat dissipation. The invention also facilitates repairs and maintenance of components.

The present invention can also realize manufacturing advantages, since the integrity of a desired independent testing of the CCD and/or support electronics can proceed without compromise, since these entities are located on independent ceramics.

BRIEF DESCRIPTION OF THE DRAWING

The invention is illustrated in the accompanying drawings, in which.

DETAILED DESCRIPTION OF THE INVENTION

Figure 1A:
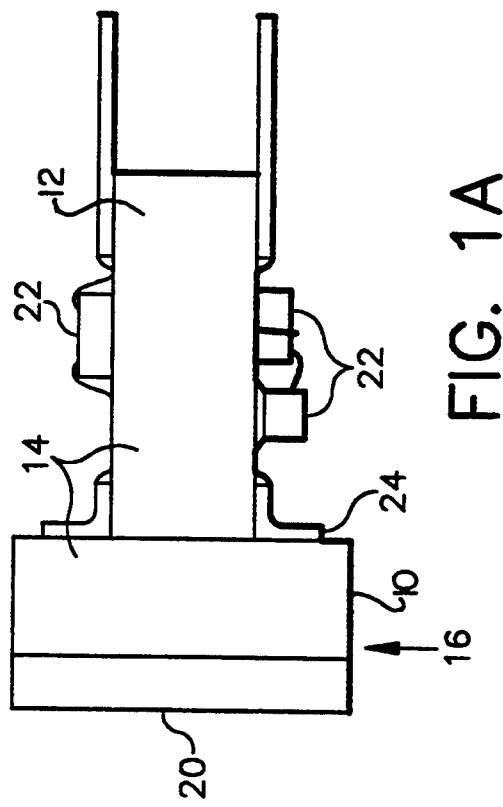
FIGS. 1A, B, C show top and side views respectively of one aspect of the present invention.

The integrated circuit package of the present invention is preferably constructed in accordance with a four-stage process. In overview, a first stage comprises co-firing first and second ceramic bodies for creating a single integrated package; a second stage comprises attaching appropriate support electronics to the second ceramic body; a third stage comprises testing the support electronics located on the second ceramic body; and, a fourth stage comprises attaching a CCD image sensor to the first ceramic body. Attention is now directed to FIGS. 1A, B, C which aid in understanding this four-stage process.

FIG. 1A shows a first ceramic body 10 preferably perpendicularly juxtaposed to a second ceramic body 12. The first and second ceramic bodies 10,12 are co-fired during a conventional fabrication process, for creating a single integrated package 14.

Figure 1B:
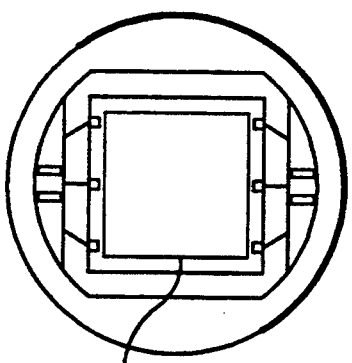

The first ceramic body 10 preferably comprises a parallelepiped and typically defines a length of from 5 mm to 8 mm and a thickness of approximately 1 mn, in order to mate congruently with a CCD image sensor. These dimensions can be suitably adjusted, to accommodate emergent CCD's of ever increasing diminution in image head size. The first ceramic body 10 defines a face surface/cavity 16 that can mount and accommodate a conventional CCD image sensor (shown in FIG. 1B, numeral 18). The CCD image sensor 18 typically comprises a transparent window 20 that is preferably positioned at the face surface/cavity 16.

The second ceramic body 12 preferably forms a circuit and mounting structure for known electronic components 22 which can support the operation of the CCD image sensor 18. To this end, the second ceramic body 12 preferably comprises a parallelepiped and preferably has a thickness of approximately 1 mm, a width of approximately 5 to 8 mm, and a variable length, say from 10 to 20 mm, in order to accommodate a desired complexity of electrical capabilities. Note that this length variability is an important feature of the present invention, since the FIG. 1 structural arrangement can accommodate an ever increasing diminution of CCD image head size with a concomitant increase in geometry dedicated to proximally located support electronics. Note, further, that the support electronics 22 can be positioned on either or both sides of the second ceramic body 12, and that both sides may be electrically connected and plated via holes.

Figure 1C:
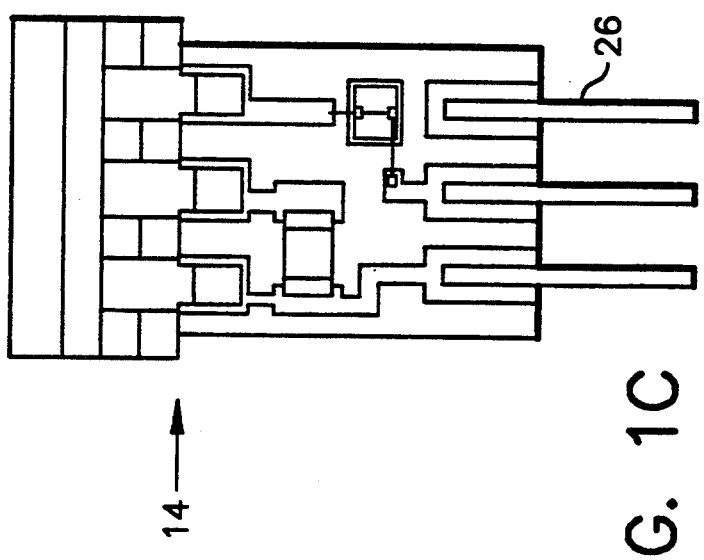

FIGS. 1A and 1C show different side views of the single integrated package 14, and make clear the utility of conventional Kovar connectors 24, Kovar pins 26 which may be employed to complete the integrated package 14.

Figure 2A:
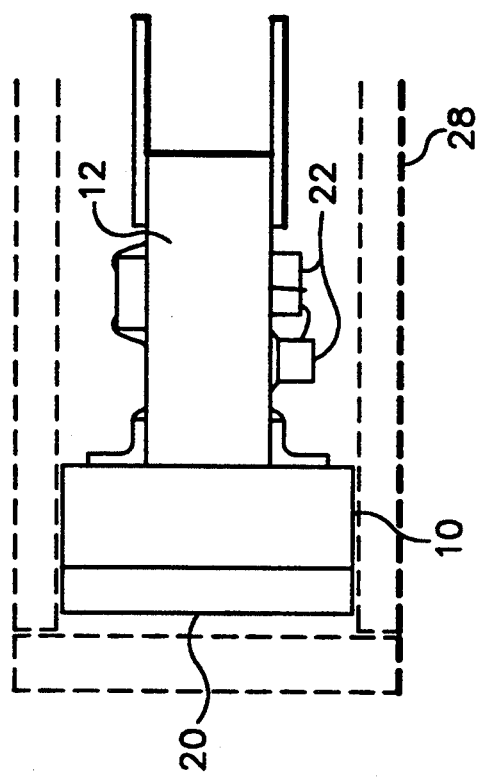
FIGS. 2A, B, C show top and side views respectively of a second aspect of the present invention.
Figure 2B:
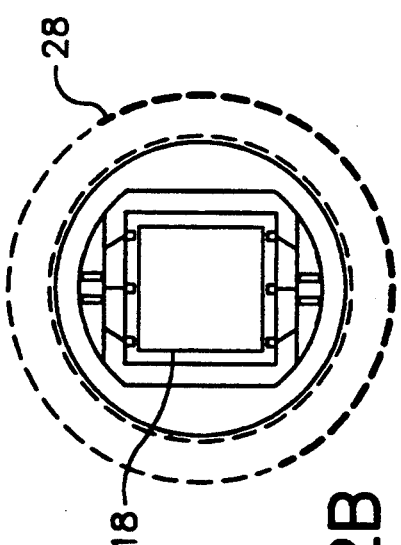
Figure 2C:
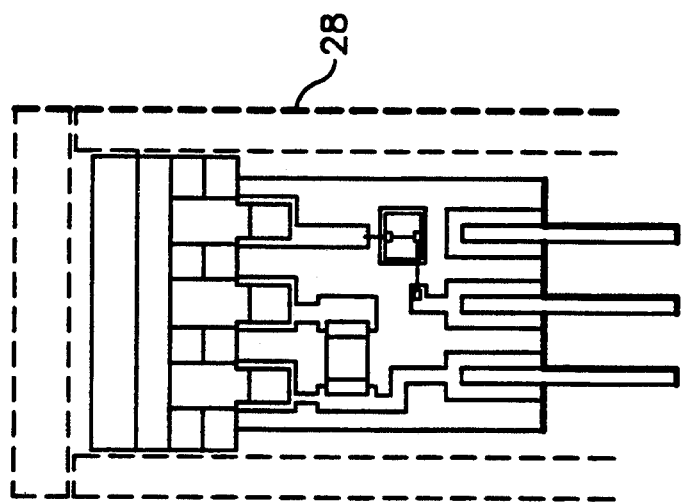

FIGS. 2A, B, C re-capitulate the information shown in FIGS. 1A, B, C and add various views of a preferred conventional probe housing 28 surrounding the integrated package 14.

What is claimed is:
1. An integrated circuit package comprising:
   (a) first and second ceramic bodies being fused together to form a T-shaped unitary structure;
   (b) a CCD image sensor mounted on the first ceramic body; and
   (c) electrical circuitry mounted on the second ceramic body wherein the first ceramic body and the second ceramic body have an arrangement that accommodates the CCD image sensor having an ever increasing diminution in size and the electrical circuitry having a concomitant increase in size.
2. An integrated circuit package according to claim 1, wherein the first ceramic body comprises a parallelepiped.
3. An integrated circuit package according to claim 2, wherein the parallelepiped comprises a length from 5 mm to 8 mm.
4. An integrated circuit package according to claim 2, wherein the parallelepiped comprises a thickness of approximately 1 mm.
5. An integrated circuit package according to claim 1, wherein the second ceramic body comprises a parallelepiped.
6. An integrated circuit package according to claim 5, wherein the second ceramic body comprises a length of from 10 to 20 mm in order to accommodate the electrical components of the CCD.
7. An integrated circuit package according to claim 5, wherein the second ceramic body comprises a width of from 5 to 8 mm.
8. An integrated circuit package according to claim 1, wherein the second ceramic body is perpendicular to the first supporting ceramic body.

* * * * *